US008573836B2

(12) United States Patent  
Sasaki et al.

(10) Patent No.: US 8,573,836 B2  
(45) Date of Patent: Nov. 5, 2013

(54) APPARATUS AND METHOD FOR EVALUATING A SUBSTRATE MOUNTING DEVICE

(75) Inventors: Yasuharu Sasaki, Nirasaki (JP); Takehiro Ueda, Nirasaki (JP); Taketoshi Okajo, Nirasaki (JP); Kaoru Oohashi, Miyagi-gun (JP)

(73) Assignee: Tokyo Electron Limited, Tokyo (JP)

( * ) Notice: Subject to any disclaimer, the term of this patent is extended or adjusted under 35 U.S.C. 154(b) by 142 days.

(21) Appl. No.: 11/925,158

(22) Filed: Oct. 26, 2007

(65) Prior Publication Data

US 2008/0098833 A1 May 1, 2008

Related U.S. Application Data

(60) Provisional application No. 60/870,803, filed on Dec. 19, 2006.

(30) Foreign Application Priority Data

Oct. 26, 2006 (JP) ................................. 2006-290840

(51) Int. Cl.  
*G01N 17/00* (2006.01)  
*H01L 21/00* (2006.01)

(52) U.S. Cl.  
USPC ............... 374/141; 374/5; 374/178; 374/137; 374/1; 374/57; 374/121; 374/129; 702/99; 438/5; 438/121

(58) Field of Classification Search  
USPC ......... 374/120, 121, 129, 141, 137, 112, 166, 374/167, 110, 115, 100, 4, 5, 57, 1, 2, 124; 250/338.1  
See application file for complete search history.

(56) References Cited

U.S. PATENT DOCUMENTS

| 5,098,198 A | * | 3/1992 | Nulman et al. | 374/121 |
| 5,662,469 A | * | 9/1997 | Okase et al. | 432/6 |
| 5,743,643 A | * | 4/1998 | Gronet et al. | 374/121 |
| 5,775,808 A | * | 7/1998 | Pan | 374/161 |

(Continued)

FOREIGN PATENT DOCUMENTS

| EP | 915499 A2 * | 5/1999 |
| JP | 10-12563 | 1/1998 |

(Continued)

OTHER PUBLICATIONS

Office Action issued Aug. 22, 2011 in Japan Application No. 2006-290840 (With English Translation).

(Continued)

*Primary Examiner* — Gail Verbitsky  
(74) *Attorney, Agent, or Firm* — Rothwell, Figg, Ernst & Manbeck, P.C.

(57) ABSTRACT

An apparatus evaluates a substrate mounting device adapted to hold a target substrate placed on a mounting surface and to control a temperature of the target substrate. The apparatus includes an evacuatable airtightly sealed chamber accommodating therein the substrate mounting device, a heat source, arranged in a facing relationship with the mounting surface, for irradiating infrared light. The apparatus further includes an evaluation-purpose substrate adapted to be mounted on the mounting surface in place of the target substrate, the evaluation-purpose substrate being made of an infrared light absorbing material, and having a unit for measuring temperatures at plural sites on a surface and/or inside of the substrate.

8 Claims, 5 Drawing Sheets

(56) References Cited

U.S. PATENT DOCUMENTS

| | | | |
|---|---|---|---|
| 6,174,583 B1 * | 1/2001 | Yamada et al. | 428/67 |
| 6,423,400 B1 * | 7/2002 | Yushio et al. | 428/210 |
| 6,479,801 B1 * | 11/2002 | Shigeoka et al. | 219/502 |
| 6,481,886 B1 * | 11/2002 | Narendrnath et al. | 374/141 |
| 6,572,265 B1 * | 6/2003 | Gotthold et al. | 374/161 |
| 6,575,622 B2 * | 6/2003 | Norrbakhsh et al. | 374/141 |
| 6,616,332 B1 * | 9/2003 | Renken et al. | 374/162 |
| 6,929,874 B2 * | 8/2005 | Hiramatsu et al. | 428/698 |
| 8,047,706 B2 * | 11/2011 | Goodman et al. | 374/1 |
| 8,104,951 B2 * | 1/2012 | Aderhold et al. | 374/5 |
| 8,395,400 B2 * | 3/2013 | Nakamura | 324/750.08 |
| 2006/0001028 A1 * | 1/2006 | Van Munster | 257/77 |
| 2006/0190211 A1 * | 8/2006 | Schietinger et al. | 702/134 |
| 2006/0240287 A1 * | 10/2006 | Kumagai et al. | 428/698 |
| 2006/0275933 A1 * | 12/2006 | Du Bois et al. | 438/14 |
| 2007/0086503 A1 * | 4/2007 | Fujii | 374/1 |
| 2007/0167029 A1 * | 7/2007 | Kowalski et al. | 438/769 |
| 2009/0209090 A1 * | 8/2009 | Yokoyama et al. | 438/476 |

FOREIGN PATENT DOCUMENTS

| | | | |
|---|---|---|---|
| JP | 11080953 A | * | 3/1999 |
| JP | 2005235845 A | * | 9/2005 |
| JP | 2006-5177 | | 1/2006 |
| JP | 2006-86301 | | 3/2006 |
| JP | 2010024475 A | * | 2/2010 |

OTHER PUBLICATIONS

Office Action issued Feb. 10, 2012 in Japanese Patent Application No. 2006-290840 (with English translation).

* cited by examiner (Si)

APPARATUS AND METHOD FOR EVALUATING A SUBSTRATE MOUNTING DEVICE

FIELD OF THE INVENTION

The present invention relates to an apparatus and method for evaluating a substrate mounting device used in fixing a target substrate, such as a silicon wafer or the like and controlling a temperature of the target substrate in a semiconductor manufacturing process and, more particularly, to an apparatus and method for easily evaluating the functions of a substrate mounting device in case a target substrate receives heat from the outside in a plasma treatment process and so forth.

BACKGROUND OF THE INVENTION

In the field of semiconductor manufacture, widespread use is made of a plasma processing apparatus that performs etching and film-forming by applying a plasma to a target substrate such as a silicon wafer or the like (which will be referred to as a "substrate" hereinafter). Such plasma processing is carried out under a depressurized pressure, which makes it impossible to use a vacuum chuck in holding the substrate in place. Thus, substrate mounting devices such as a mechanical clamp and an electrostatic chuck using an electrostatic force are put into general use.

The electrostatic chuck includes a substrate mounting surface formed of an insulating body having a sheet electrode embedded therein. A high potential is applied to the sheet electrode so that a Coulomb force or a Johnsen-Rahbek force can be generated by the static electricity distributed in the dielectric body and the polarized and electrified charges of the substrate. This force is used for the electrostatic chuck to fix the substrate to the substrate mounting surface.

Although the basic function of the electrostatic chuck is to attract and hold the substrate, it is recently the general case that the electrostatic chuck is used for the purpose of controlling a silicon wafer temperature in a wafer machining process, e.g., for the purpose of cooling a silicon wafer with the stream of an inert gas such as helium or the like flowing between the silicon wafer and the electrostatic chuck or for the purpose of heating the silicon wafer through the combined use with a heater. This is because a film-forming temperature has an extremely close relationship with a film-forming speed, a film-forming quality and the like.

For this reason, in addition to mechanical properties, particle reduction, purity improvement, a plasma resistance and a chemical resistance, the silicon wafer temperature control function and the temperature distribution uniformity when the silicon wafer is subjected to film-forming and etching become the evaluation items of paramount importance in evaluating the electrostatic chuck.

In general, the temperature control function depends on the heat applied to a substrate and a mounting table from the outside. The characteristics involved in a attracting and holding function, such as an adsorptive force, a leak current and attachment-detachment responsiveness, have an influence on the temperature of a target substrate.

Therefore, the performance evaluation of an electrostatic chuck used in a plasma processing apparatus needs to be conducted under a condition that takes into account the heat inflow from plasma to a substrate and a mounting table. If a wrong heat inflow condition is used in the performance evaluation, the results of evaluation will differ greatly from the evaluation results obtained under an actual condition to be applied.

If the plasma processing apparatus is used to measure the characteristics of the electrostatic chuck under the same condition as that of an actual etching process or other actual processes, it would be possible to correctly evaluate the performance of the electrostatic chuck. However, use of the plasma processing apparatus only for the evaluation purpose costs much because the plasma processing apparatus is expensive and complex-to-operate. Another problem lies in that the time and effort required in the evaluation becomes too great.

In view of these circumstances, JP2006-86301A discloses an electrostatic chuck evaluating apparatus and method in which an electrostatic chuck is evaluated by installing the electrostatic chuck within a vacuum-evacuatable sealed chamber, heating a substrate with a lamp heater arranged above the electrostatic chuck and simulating a thermal condition available within a plasma processing apparatus.

As disclosed in JP2006-86301A, the electrostatic chuck evaluating method performed by an evaluation apparatus that simulates heat inflow from a plasma using a lamp heater (halogen lamp) as an external heat source is preferable in that the method makes it possible to evaluate the performance of an electrostatic chuck in a quite easy manner.

However, an investigation conducted by the present inventors reveals that the electrostatic chuck evaluating method disclosed in JP2006-86301A encounters a difficulty in simulating the heat inflow from a plasma.

The reason is that there is a difference in the heat transfer mechanism between the heat transfer from a plasma and the heat transfer from a conventional heating lamp or heater. In general, it is thought that the heat transfer from high temperature plasma is predominantly the contact heat transfer of molecules turned to a plasma.

In contrast, the heat transfer from a heating lamp occurs in such a way that infrared rays irradiated from a heating lamp is resonantly absorbed in a substrate, the energy of which imparts motion (vibration) to molecules so that the vibrating molecules can be rubbed with each other to generate heat.

In this regard, the infrared rays irradiated from the heating lamp mainly includes near infrared rays (with a wavelength from about 0.78 µm to 2 µm) and infrared rays (with a wavelength from about 2 µm to 4 µm). Referring to FIG. 6, a silicon wafer as a target substrate allows most of the infrared rays (infrared light) belonging to a wavelength region from about 1 µm to 5 µm to pass therethrough. For this reason, even if an attempt is made to heat the silicon wafer as a target substrate with an infrared lamp, the silicon wafer is scarcely heated and, instead, the infrared light penetrates the silicon wafer to heat only a surface (mounting surface) of an electrostatic chuck lying below the silicon wafer.

FIGS. 5A and 5B show a silicon wafer heating situation in the event that a silicon wafer (target substrate) is suction-fixed to an electrostatic chuck and then infrared rays are irradiated on the silicon wafer by an infrared lamp. When microscopically viewed, both the electrostatic chuck and the silicon wafer have irregularities on their surfaces. Therefore, as illustrated in FIG. 5A, close contact sites and spaced-apart sites exist in the contact surfaces of the electrostatic chuck and the silicon wafer.

Under this state, the light (infrared light) irradiated from the infrared lamp almost penetrates the silicon wafer as set forth earlier. Thus, as shown in FIG. 5B, the surface of the electrostatic chuck is heated in the spaced-apart sites but the contact surfaces are heated in the close contact sites. As a result, there occurs a situation that the heat of the electrostatic chuck (the heat of the substrate mounted in place) is sufficiently transferred in the close contact sites but no sufficient heat transfer occurs in the spaced-apart sites.

On the other hand, contact heat transfer is predominant in an actual process using a plasma. According to the contact heat transfer, the molecules turned to high temperature plasma make contact with a silicon wafer to generate heat. This means that the silicon wafer is uniformly heated over the entire surface thereof.

Thus, the thermal state of the electrostatic chuck and the silicon wafer in case of using an evaluation apparatus that performs simulation with the infrared light is thought to greatly differ from the thermal state in an actual plasma processing apparatus.

For the above-noted purpose, it is usually most preferable to use an infrared heater, which is inexpensive and exhibits an improved heating efficiency. However, in order for an evaluation apparatus using the infrared heater to simulate the thermal state of a plasma processing apparatus, the evaluation apparatus needs to be designed to ensure that the thermal state within the apparatus corresponds to the thermal state of an actual plasma processing apparatus.

SUMMARY OF THE INVENTION

It is therefore an object of the present invention to provide a means adapted for use in an evaluation apparatus using an infrared heater as a heat source to evaluate the performance of a substrate mounting device, the means capable of creating a thermal state corresponding to an actual plasma processing apparatus and hence easily simulating a thermal state of the plasma processing apparatus to evaluate the performance of the substrate mounting device.

In a means for easily evaluating the performance of a substrate mounting device, it is usual to measure a temperature or a temperature distribution of an target substrate fixed to the substrate mounting device. Typically employed in measuring the temperature is an embedded or attached thermocouple type temperature measuring means that can reliably obtain measurement values with increased accuracy. A substrate only for evaluation equipped with a thermocouple is often used.

The present inventors have conceived this invention from the fact that the above-noted object is achieved by not using an infrared-transmitting silicon wafer but using a silicon wafer with a reduced infrared transmittance and an increased infrared absorption coefficient, as the substrate for exclusive use in evaluation (hereinafter referred to as an "evaluation-purpose substrate").

In general, ceramic materials have a reduced tendency to transmit infrared light. However, materials of the evaluation-purpose substrate need not only to have a reduced infrared transmittance but also to comply with several other requirements. One of the requirements is to make sure that the substrate mounting device is not contaminated by the evaluation-purpose substrate. Another requirement is that the thermal properties of the materials such as heat conductivity and specific heat should be similar to those of the silicon wafer. As a result of in-depth investigations on the ceramic materials complying with such requirements, the present inventors have found that the problems mentioned above are all solved if silicon carbide (SiC) is used as a material of the evaluation-purpose substrate. Consequently, the present inventors have come to finalize the present invention.

In accordance with an aspect of the present invention, there is provided an apparatus for evaluating a substrate mounting device adapted to attract and hold a target substrate placed on a mounting surface and to control a temperature of the target substrate, including: an evacuatable sealed chamber for receiving the substrate mounting device; a heat source arranged in a facing relationship with the mounting surface for irradiating infrared light. The apparatus further includes a evaluation-purpose substrate adapted to be mounted on the mounting surface in place of the target substrate, the evaluation-purpose substrate made of an infrared light absorbing material, the evaluation-purpose substrate having a unit for measuring temperatures in a plurality of surface or interior sites of the evaluation-purpose substrate.

It is particularly preferred that the substrate mounting device is an electrostatic chuck and the evaluation-purpose substrate is made of silicon carbide. The first reason for the preferred use of silicon carbide is that silicon carbide contains exclusively of Si and C, thus eliminating a fear that silicon carbide becomes a cause of metal contamination of a silicon wafer. Although ceramic materials such as Al-based or Ti-based oxides, carbides and nitrides have a low infrared transmittance and therefore may be used as a material of the evaluation-purpose substrate, it is more preferably to use SiC, which is less likely to become a cause of contamination, in a process requiring a higher cleanliness.

The second reason for the preferred use of silicon carbide is that, among ceramic materials, silicon carbide exhibits significantly high heat conductivity which is almost close to that of silicon. Specific heat of silicon carbide is also substantially the same as that of silicon. Therefore, the heat transfer between the electrostatic chuck and the substrate tends to occur quite similarly in the silicon wafer and the evaluation-purpose substrate made of silicon carbide, which characteristics are highly beneficial in evaluating the performance of the electrostatic chuck, especially the thermal properties thereof.

In accordance with another aspect of the present invention, there is provided a method for evaluating a substrate mounting device, including: providing the substrate mounting device within an evacuatable sealed chamber, the substrate mounting device adapted to attract and hold a target substrate placed on a mounting surface and to control a temperature of the target substrate; mounting an evaluation-purpose substrate made of an infrared light absorbing material on the substrate mounting device, the evaluation-purpose substrate having a unit for measuring temperatures in a plurality of surface or interior sites of the evaluation-purpose substrate; heating the evaluation-purpose substrate by means of a heat source adapted to irradiate infrared light toward the mounting surface; and evaluating the characteristics of the substrate mounting device including a temperature distribution of the evaluation-purpose substrate obtained by the unit for measuring temperatures. It is particularly preferred that the substrate mounting device is an electrostatic chuck and the evaluation-purpose substrate is made of silicon carbide.

In accordance with the aspects of the present invention, it becomes possible to simulate, with a simple means, a heat inflow condition similar to the heat inflow from a plasma to a substrate attracted and held to a substrate mounting device in the event that an electrostatic chuck is used in, e.g., a plasma processing apparatus. This makes it possible to accurately and easily evaluate the thermal properties of the substrate mounting device according to an actual application condition in the plasma processing apparatus.

BRIEF DESCRIPTION OF THE DRAWINGS

The above and other objects and features of the present invention will become apparent from the following description of example embodiments, given in conjunction with the accompanying drawings, in which.

DETAILED DESCRIPTION OF THE PREFERRED EMBODIMENTS

Hereinafter, preferred embodiments of the present invention will be described with reference to the accompanying drawings which forms a part here of. However, the present invention is not limited thereto.

Figure 1:
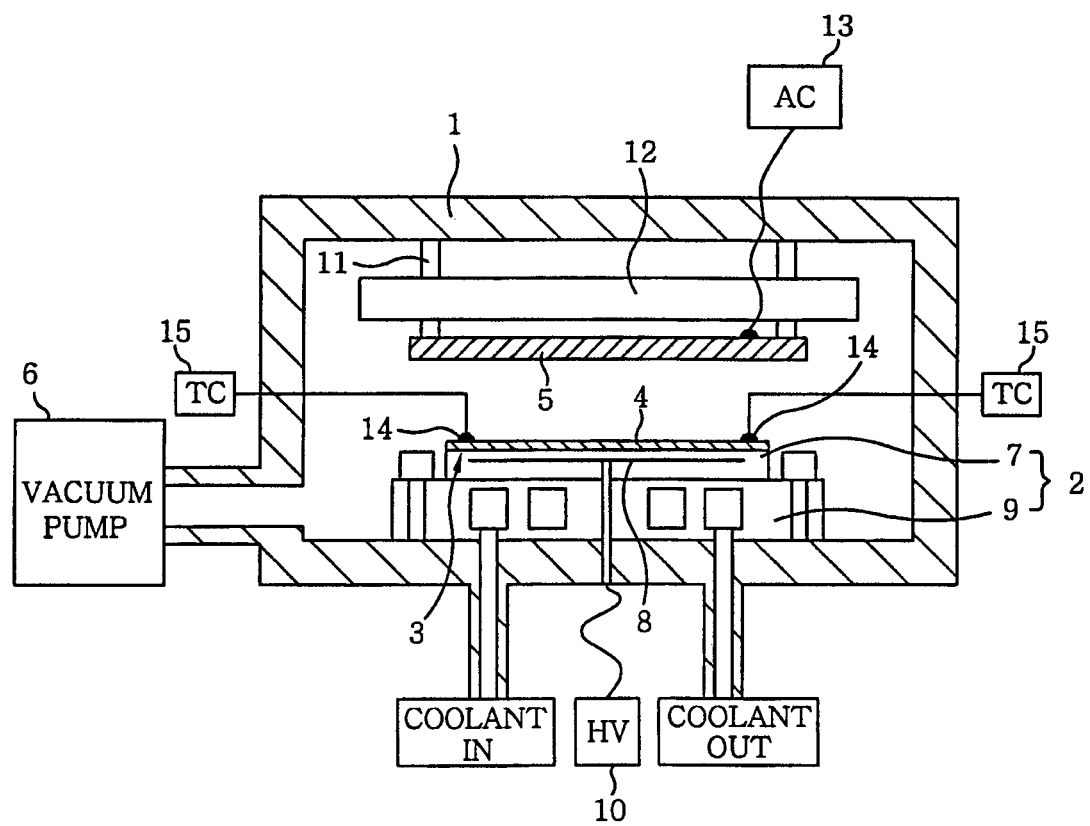
FIG. 1 is a schematic section view showing an electrostatic chuck evaluating apparatus in accordance with an embodiment of the present invention.

FIG. 1 is a schematic section view showing an electrostatic chuck evaluating apparatus in accordance with an embodiment of the present invention. This apparatus includes an airtightly sealed chamber 1, an electrostatic chuck 2 provided within the chamber 1, an evaluation-purpose substrate 4 mounted on a mounting surface 3 of the electrostatic chuck 2, an infrared heater 5 arranged to be faced with the mounting surface 3 for heating the evaluation-purpose substrate 4, and a vacuum pump 6 for vacuum-evacuating the chamber 1.

The electrostatic chuck 2 is of the structure wherein an electrode 8 is embedded in an insulating body 7 including the mounting surface 3. The insulating body 7 is fixed on a cooling plate 9. A coolant flow path is formed within the cooling plate 9 so that coolant can flow into and out of the coolant flow path through inlet and outlet pipes. A high voltage is applied to the electrode 8 from a DC power supply 10.

The infrared heater 5 is attached to a ceiling of the chamber 1 via insulating posts 11. A thermal insulating plate 12 is arranged over a rear surface of the heater 5 to prevent the ceiling from being overheated. Electric power is supplied to the heater 5 from an AC power supply 13 disposed outside the chamber 1. The electric power thus supplied is controlled to a suitable value by means of a control device (not shown).

Thermocouples 14 are attached to the surface or interior of the evaluation-purpose substrate 4 in a plurality of sites (two sites in the illustrated embodiment). The electromotive power of the thermocouples 14 is transferred to external thermometers 15 via connection terminals provided on inner walls of the chamber 1 so that the temperatures of different portions of the evaluation-purpose substrate 4 can be measured by the thermometers 15.

In the present invention, the electrostatic chuck 2 subjected to evaluation is not particularly limited in a specific type. For example, the insulating body 7 may be either a ceramic body formed by thermal spraying or sintering or an insulating resin body such as a polyimide film. The electrode 8 may be of any shape, including a film shape, a sheet shape and a spiral shape, as long as it can uniformly apply a voltage to the whole surface of the target substrate.

The cooling plate 9 and the insulating body 7 are preferably bonded together to assure improved heat transfer. The cooling plate 9 is preferably constructed from a material exhibiting increased heat conductivity.

Alternatively, it may be possible to employ a cooling system by which coolant such as a helium gas or the like is allowed to flow between the evaluation-purpose substrate 4 and the insulating body 7 to thereby directly cool the evaluation-purpose substrate 4. Further, a heater may be arranged inside the cooling plate 9 so that the cooling plate 9 can be used as a heat source and not a heat sink.

It is preferred that the chamber 1 is vacuum-evacuated into a pressure of several Torr or less, namely a vacuum pressure generally equal to the pressure within various kinds of plasma processing chamber. Further, the infrared heater 5 used in the present invention is not particularly limited in a specific type. There are known many kinds of infrared heaters in the art. Generally, it may be possible to use an infrared heater of the type capable of heating a metal heating wire, graphite or conductive ceramic, transferring the heat to an infrared irradiation body (typically, ceramic or carbon) and allowing the irradiation body to heat an object body with a radiant heat. It is preferred that the infrared heater 5 is of the shape and structure capable of substantially uniformly heating the whole surface of a substrate.

It is particularly preferred that the evaluation-purpose substrate 4 is made of silicon carbide consisting exclusively of Si and C. This is because an extremely clean environment is required in a semiconductor device manufacturing process, making it necessary to strictly prevent contaminants from adhering to an electrostatic chuck. Silicon carbide consists exclusively of Si and C, among which Si is the very constituent element of a silicon wafer. At the substrate temperature kept in the electrostatic chuck evaluating process, C of SiC does not undergo decomposition to become a cause of contamination. In other words, if SiC is used as a constituent material of the evaluation-purpose substrate 4, there is virtually no possibility that the silicon wafer is contaminated by other elements.

Examples of Si-based ceramic containing nonmetalic elements other than Si include not only silicon carbide (SiC) but also silicon oxide ($SiO_2$) and silicon nitride ($Si_3N_4$). Among them, it is particularly preferable to use SiC. The reason is that SiC is available at a low price, easy to machine and superior in its thermal properties, as compared to other Si-based ceramic.

The heat applied to the silicon wafer (evaluation-purpose substrate) by a plasma (or the infrared heater) formed (or arranged) over the silicon wafer is transferred to the electrostatic chuck, and the heat transfer is governed by the heat conductivity and specific heat of the substrate. It is preferred that the thermal properties of the evaluation-purpose substrate and the silicon wafer used in an actual semiconductor manufacturing process (the actual substrate) are generally similar to each other.

The heat conductivity k of silicon is as high as 150 W/mK. However, the heat conductivity k of typical ceramic is very low. For example, the heat conductivity k of alumina or silicon nitride is from about 20 to 30 W/mK and the heat conductivity k of silica is even lower than that of alumina or silicon nitride. Therefore, if these materials are used in producing the evaluation-purpose substrate, there is an anxiety that the heat is not smoothly transferred from the top to the electrostatic chuck and the temperature of the substrate differs from that of the silicon wafer.

On the other hand, the heat conductivity k of silicon carbide is quite higher than that of typical ceramic and is from about 60 to 200 W/mK depending on the degree of crystallization of silicon carbide. Therefore, use of SiC in producing the evaluation-purpose substrate makes it possible to obtain a heat transfer condition similar to that of the silicon wafer. Silicon wafer, silicon carbide, silica, silicon nitride and alumina show no great difference in specific heat and, typically, the specific heat of these materials is from about 0.6 to 0.9 J/gK.

Figure 2:
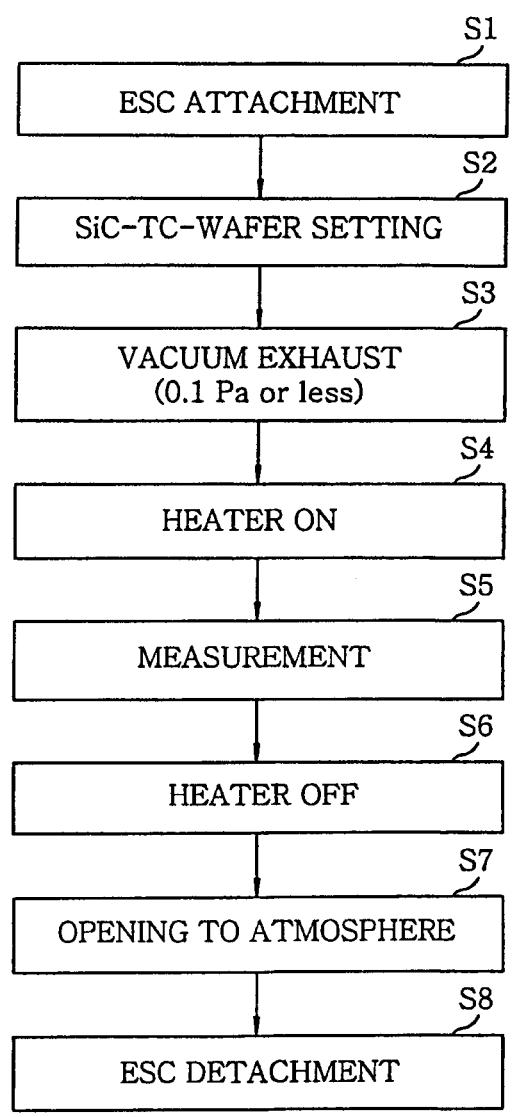
FIG. 2 is a flowchart illustrating one example of a working sequence in the present electrostatic chuck evaluating apparatus.

Next, description will be made on a working sequence in the evaluating apparatus of the present embodiment. FIG. 2 is a flowchart illustrating the working sequence. First, an electrostatic chuck 2 to be evaluated (identified by an abbreviation "ESC") is set in a specified position within an air-tight chamber 1 and is fixed in place by means of bolts or the like (S1). At the same time, coolant inlet and outlet pipes are arranged in position. Then, an evaluation-purpose substrate 4 having a predetermined number of thermocouples 14 attached to specified positions is set on a mounting surface 3 of the ESC 2 and a high potential is applied to an electrode of the ESC 2 so that the evaluation-purpose substrate 4 can be attracted and held to the ESC 2 by an electrostatic force (S2). The wirings of the thermocouples 14 are led to the outside of the airtightly sealed chamber 1 through a terminal box provided on the inner wall surface of the chamber 1. In an air-tight state, the chamber 1 is evacuated by a vacuum pump into a vacuum degree of about 0.1 Pa (S3).

Then, an infrared heater 5 is turned on (S4). By conducting a blank test in advance, the electric power supplied to the infrared heater 5 is set to such a level as to simulate the heat inflow from a plasma of a plasma processing chamber. Concurrently, the ESC 2 and the evaluation-purpose substrate 4 are cooled by allowing coolant to flow through a cooling plate 9. In this condition, the evaluation-purpose substrate 4 is heated for a predetermined time period, after which the temperature distribution of the substrate 4 is measured by the thermocouples 14 attached to the evaluation-purpose substrate 4 (S5). Based on the temperature measurement data thus obtained, it is possible to conduct performance evaluation for a temperature control function and a attracting and holding function of the ESC 2.

The heat transfer between the mounting surface 3 of the ESC 2 and the substrate 4 depends largely on the degree of close contact therebetween. This means that, if the ESC 2 has a low adsorptive force, the substrate 4 is cooled insufficiently. Further, the temperature uniformity of the evaluation-purpose substrate 4 is one of the important requirements. If the ESC 2 exercises a low adsorptive force and fails to uniformly suck up the whole portions of the substrate 4, it is impossible to assure the uniformity of the substrate temperature. In a nutshell, various kinds of information for evaluation of the functions of the ESC 2 can be obtained by measuring the substrate temperature. It may be possible to measure a leak current of the ESC 2 simultaneously with the temperature measurement.

At the end of measurement, the infrared heater 5 is turned off (S6), after which the air-tight chamber 1 is opened to the atmosphere (S7) and the ESC 2 is taken out (S8), thus terminating a series of measuring tasks.

EXAMPLES

Using five electrostatic chucks 2 of the same type, the temperature of an evaluation-purpose substrate within the present an evaluating apparatus (the evaluating apparatus as shown in FIG. 1) was measured in the order illustrated in FIG. 2. For the purpose of comparison, five electrostatic chucks 2 of the same type were prepared and thermocouples 14 were attached to an actually processed silicon wafer as in the evaluation-purpose substrate 4. The ESC 2 and the silicon wafer were set within an actual plasma processing apparatus (namely, a plasma etching apparatus which will be referred to as an "actual apparatus" hereinafter). The temperatures of the thermocouples 14 attached to the silicon wafer were measured in a plasma-generating state.

Figure 3:
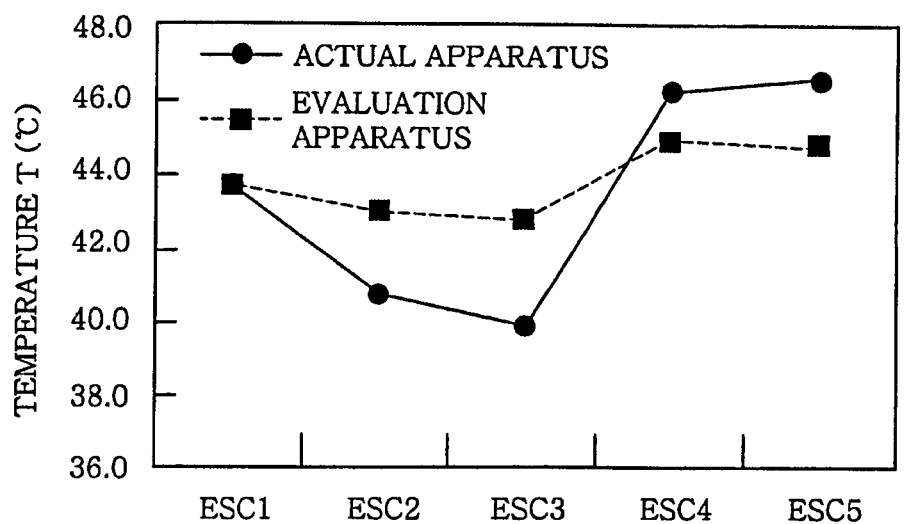
FIG. 3 is a graph illustrating one example of substrate temperature measurement results in accordance with the embodiment of the present invention.

The results of temperature measurement are shown in FIG. 3. In this figure, the term "actual apparatus" means that the temperature of the silicon wafer was measured in the actual plasma processing apparatus, and the term "evaluation apparatus" means that the temperature of the evaluation-purpose substrate 4 was measured by means of the present evaluating apparatus. In both cases, the temperatures illustrated denote average values of the thermocouple temperatures measured at four sites i.e., intersection sites of X- and Y-axes and a 35 mm-diameter circle, wherein the four sites are decided by taking a notch (a cutout of the wafer) as a 0-degree point and dividing the 35 mm-diameter circle on a 90-degree basis. In case of the actual apparatus, the temperatures fluctuate in a range from about 40 to 46° C. and the temperature variations between the respective electrostatic chucks 2 appear to be great. In case of the evaluation apparatus, the temperatures fluctuate in a range from about 43 to 45° C. and the temperature variations between the respective electrostatic chucks 2 appear to be small. Nevertheless, the tendency of variations in the actual apparatus corresponds (correlates) well to that in the evaluation apparatus.

In an effort to more clearly indicate the correspondence relationship, the average temperatures of the measured temperatures from the five electrostatic chucks 2 were found with respect to both the actual apparatus and the evaluation apparatus, and the temperature differences between the average temperatures and the measured temperatures were calculated as follows:

Temperature difference $\Delta T$ (in actual apparatus)=temperature $T$ in each chuck of actual apparatus−average temperature (actual apparatus); and Temperature difference $\Delta T$ (in evaluation apparatus) =temperature $T$ in each chuck of evaluation apparatus−average temperature (evaluation apparatus).

Figure 4:
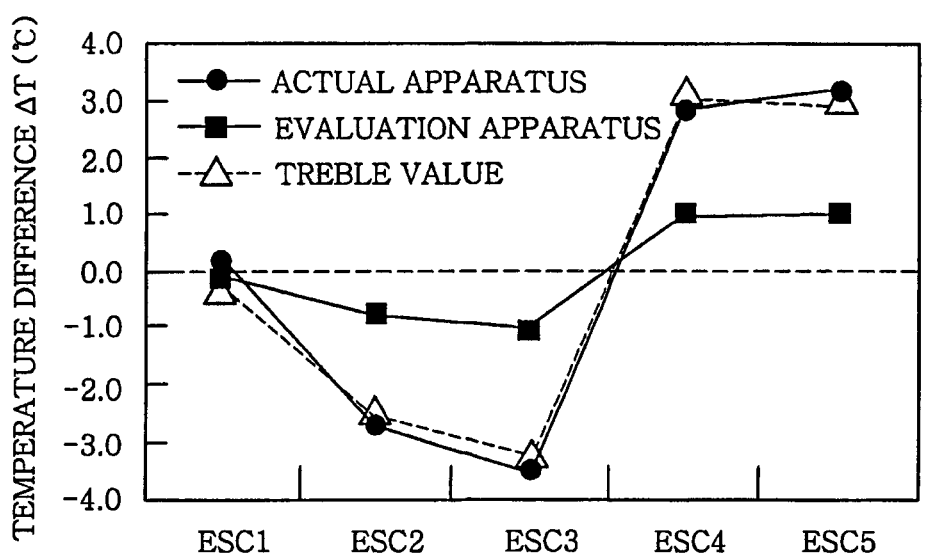
FIG. 4 is a graph representing the temperature differences ΔT between the data illustrated in FIG. 3 and the average temperatures.
Figure 5A:
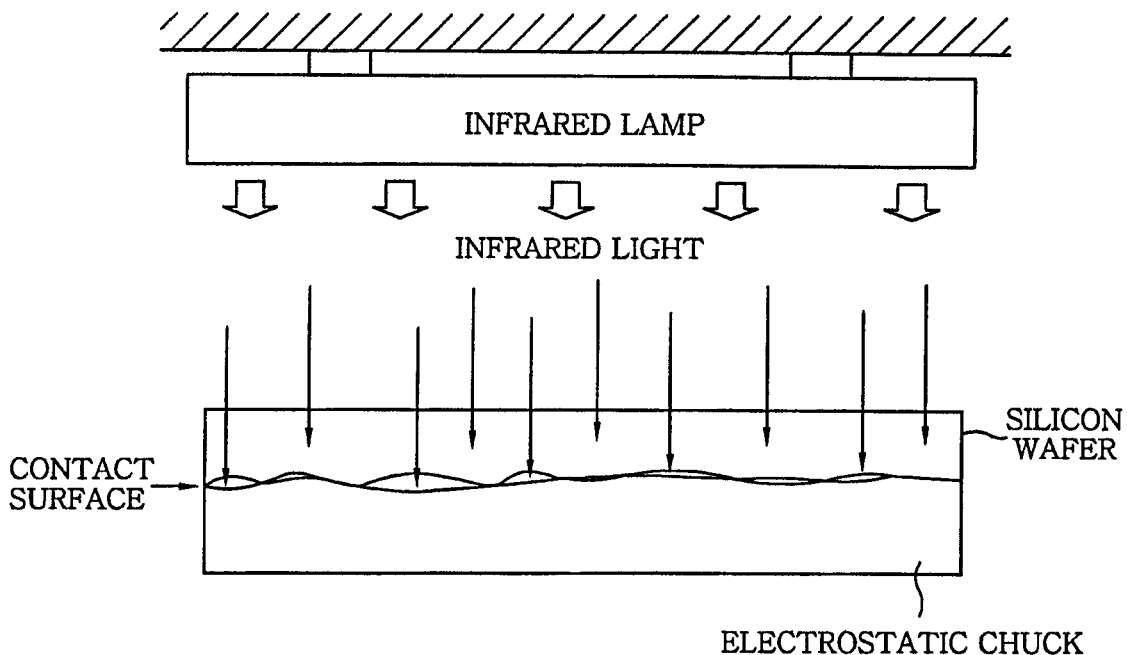
FIG. 5 is a view showing a heating situation of a silicon wafer in the event that a target substrate (silicon wafer) is attracted and held to an electrostatic chuck and then infrared rays are irradiated on the target substrate by an infrared lamp.
Figure 5B:
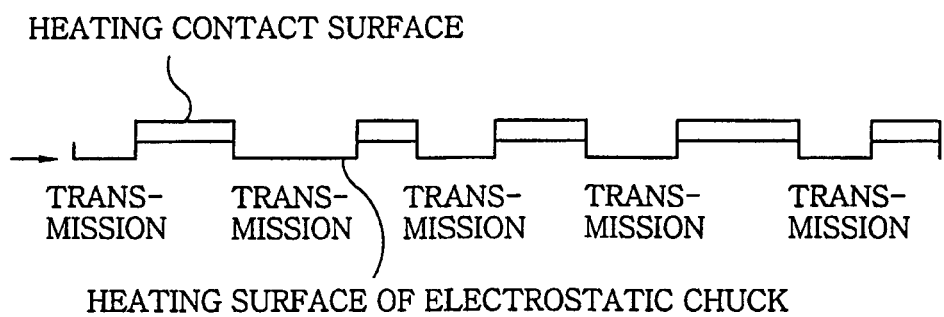
Figure 6:
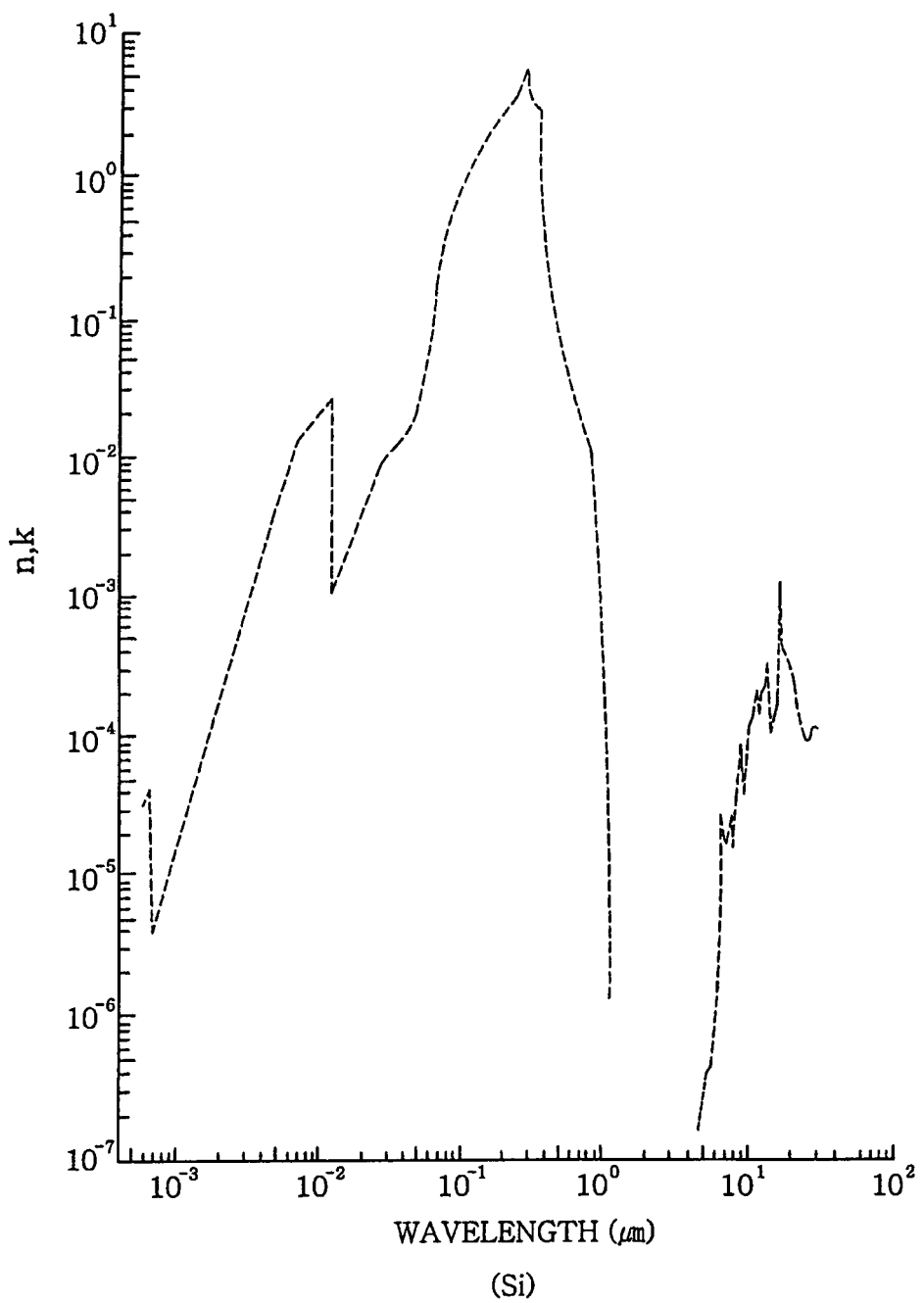
FIG. 6 is a view illustrating a light transmittance of silicon (Si).

Further, values three times as great as the $\Delta T$ in the evaluation apparatus were calculated and compared to the $\Delta T$ in the actual apparatus. As illustrated in FIG. 4, the treble values of the $\Delta T$ in the evaluation apparatus correspond well to the $\Delta T$ in the actual apparatus. Thus, it was confirmed that the measured values corresponding well to the temperature values in the actual apparatus are obtained by the evaluation apparatus in the embodiment of the present invention. In other words, as demonstrated in this example, a correlation factor of three (multiplying the $\Delta T$ obtained with the evaluation apparatus by three) allows the $\Delta T$ of the evaluation apparatus to correspond (or in other words to correlate) to the $\Delta T$ of the actual apparatus. This is confirmed by the "Treble" line in FIG. 4 (which, as noted above, is three times the values of the evaluation apparatus line) closely following the actual apparatus line. This means that the evaluation apparatus is capable of evaluating the functions of the electrostatic chuck 2 under the same thermal condition as that of the actual apparatus. Moreover, it is thought that, if the heat inflow level from the infrared heater is increased in the evaluation apparatus, it will be possible to obtain a result closer to the temperature in the actual apparatus.

While the invention has been shown and described with respect to the embodiment, it will be understood by those skilled in the art that various changes and modifications may be made without departing from the scope of the invention as defined in the following claims.

What is claimed is:

1. An apparatus dedicated to evaluate a substrate mounting device, wherein the substrate mounting device includes a mounting surface adapted to hold a substrate placed on the mounting surface, and wherein the substrate mounting device controls a temperature of the substrate mounted on the mounting surface, comprising:
an evacuatable airtightly sealed chamber accommodating therein the substrate mounting device;
an evaluation-purpose substrate to be mounted on the mounting surface, the evaluation-purpose substrate being made of a near infrared light absorbing material, and having a unit for measuring temperatures at plural sites on a surface and/or inside of the evaluation-purpose substrate;
and
a heat source, arranged in a facing relationship with the mounting surface, to irradiate infrared light substantially uniformly to the whole surface of the evaluation-purpose substrate,
wherein, from a previously obtained determination, a correlation factor relates temperature information of the evaluation-purpose substrate exposed to the infrared light irradiating the whole surface of the evaluation-purpose substrate, using the unit for measuring temperatures at said plural sites, to temperature information previously obtained from an actual substrate mounted on an identical substrate mounting device in a plasma processing chamber and exposed to plasma processing,
wherein the substrate mounting device in the evacuatable chamber is an electrostatic chuck, and
wherein the evaluation-purpose substrate is made of silicon carbide, the evaluation-purpose substrate having a heat conductivity ranging from about 60 to 200 W/mK.

2. The apparatus of claim 1, wherein the evaluation-purpose substrate has a specific heat ranging from about 0.6 to 0.9 J/gK.

3. The apparatus of claim 1, wherein the correlation factor scales measured temperature information of the evaluation-purpose substrate to obtain temperature information corresponding to that of the actual substrate during plasma processing.

4. The apparatus of claim 3, wherein the correlation factor scales the measured temperature information of the evaluation-purpose substrate by a factor of three to obtain the temperature information corresponding to that of the actual substrate during plasma processing.

5. A method for evaluating a substrate mounting device, comprising:
providing the substrate mounting device within an evacuatable airtightly sealed chamber, the substrate mounting device including a substrate mounting surface adapted to hold a substrate, and wherein the substrate mounting device controls a temperature of the substrate;
mounting an evaluation-purpose substrate made of a near infrared light absorbing material on the substrate mounting device, the evaluation-purpose substrate having a unit for measuring temperatures at plural sites on a surface and/or inside of the evaluation-purpose substrate;
heating the evaluation-purpose substrate by means of a heat source to irradiate infrared light toward the mounting surface and onto the evaluation-purpose substrate; and
correlating temperature information of the evaluation-purpose substrate exposed to the infrared light irradiating the whole surface of the evaluation-purpose substrate and obtained by the temperature measuring unit to temperature information of an actual substrate mounted on an identical substrate mounting device and exposed to plasma processing, based on a relationship between temperature information of the evaluation-purpose substrate exposed to infrared light and temperature information of an actual substrate obtained while the actual substrate was exposed to plasma; and
evaluating the substrate mounting device in the evacuatable chamber based on temperature information of the evaluation-purpose substrate and said relationship between temperature information of the evaluation-purpose substrate and temperature information of the actual substrate,
wherein the substrate mounting device in the evacuatable chamber is an electrostatic chuck, and
wherein the evaluation-purpose substrate is made of silicon carbide, the evaluation-purpose substrate having a heat conductivity ranging from about 60 to 200 W/mK.

6. The method of claim 5, wherein the evaluation-purpose substrate has a specific heat ranging from about 0.6 to 0.9 J/gK.

7. The method of claim 5, wherein the correlating comprises scaling measured temperature information of the evaluation-purpose substrate to obtain temperature information corresponding to that of the actual substrate during plasma processing.

8. The method of claim 7, wherein the correlating comprises scaling the measured temperature information of the evaluation-purpose substrate by a factor of three to obtain the temperature information corresponding to that of the actual substrate during plasma processing.

* * * * *